United States Patent
Toyoda et al.

(10) Patent No.: US 7,481,901 B2
(45) Date of Patent: Jan. 27, 2009

(54) METHOD AND APPARATUS FOR PRODUCING A WIRING BOARD, INCLUDING FILM-PEELING

(75) Inventors: Yasushi Toyoda, Aichi (JP); Nobuyuki Tanaka, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 585 days.

(21) Appl. No.: 11/290,399

(22) Filed: Dec. 1, 2005

(65) Prior Publication Data

US 2006/0118228 A1 Jun. 8, 2006

(30) Foreign Application Priority Data

| Dec. 3, 2004 | (JP) | 2004-350569 |
| Dec. 3, 2004 | (JP) | 2004-350570 |
| Jun. 20, 2005 | (JP) | 2005-179082 |

(51) Int. Cl.
*B29C 65/50* (2006.01)
*B29C 65/54* (2006.01)
*B32B 37/12* (2006.01)
*B32B 37/16* (2006.01)
*B32B 38/04* (2006.01)
*B32B 38/10* (2006.01)
*B32B 37/22* (2006.01)
*B32B 37/30* (2006.01)
*B29C 65/56* (2006.01)

(52) U.S. Cl. ............ 156/248; 156/247; 156/250; 156/252; 156/268; 156/270; 156/304.1; 156/344; 83/861; 83/875; 83/880

(58) Field of Classification Search ............ 156/184, 156/191, 247–249, 250, 252, 253, 257, 267, 156/268, 269, 270, 304.1, 304.3, 344, 584; 83/861, 875, 880
See application file for complete search history.

(56) References Cited

U.S. PATENT DOCUMENTS 4,775,438 A * 10/1988 Funakoshi et al. .......... 156/241

(Continued)

FOREIGN PATENT DOCUMENTS

JP 10-324454 A 12/1998

(Continued)

OTHER PUBLICATIONS

Ando, Masahiro, English translation of JP10324454. Dec. 8, 1998.*

*Primary Examiner*—Philip C Tucker
*Assistant Examiner*—Sonya Mazumdar
(74) *Attorney, Agent, or Firm*—Sughrue Mion, PLLC

(57) ABSTRACT

A method for manufacturing a wiring board offering efficient operations of peeling and collection of a protective film as well as preventing a lowered yield. A method for manufacturing a build-up multilayer resin wiring board, which includes a taping process S2 and a peeling process S3. In the taping process S2, two sheets of substrate are supported and adjoined under the condition that the edges thereof are placed close to each other, and a tape is affixed so that the protective film may be connected on the edge of the substrate. In the peeling process S3, the protective films connected to each other are continuously peeled by sequentially lifting them via the tapes so that an interlayer insulation material may remain on the substrate.

9 Claims, 8 Drawing Sheets

U.S. PATENT DOCUMENTS

| | | | |
|---|---|---|---|
| 4,828,640 A * | 5/1989 | Kaya et al. | 156/248 |
| 5,441,846 A * | 8/1995 | Nagate et al. | 430/259 |
| 5,676,789 A * | 10/1997 | Hamamura | 156/344 |
| 5,746,868 A * | 5/1998 | Abe | 156/247 |
| 5,846,875 A * | 12/1998 | Haji | 438/614 |
| 6,270,889 B1 * | 8/2001 | Kataoka et al. | 428/352 |
| 6,717,248 B2 * | 4/2004 | Shin et al. | 257/678 |

FOREIGN PATENT DOCUMENTS

| | | |
|---|---|---|
| JP | 2000-86080 A | 3/2000 |
| JP | 200189018 A | 4/2001 |

* cited by examiner

METHOD AND APPARATUS FOR PRODUCING A WIRING BOARD, INCLUDING FILM-PEELING

BACKGROUND OF THE INVENTION

1. Field of the Invention

The present invention relates to a method for manufacturing a wiring board through a process that peels a protective film from a substrate having an insulation material layer protected by the protective film, and to a film peeling apparatus for use in peeling the protective film from the substrate having the insulation material layer protected by the protective film.

2. Description of the Related Art

Conventionally, a process of manufacturing a wiring board includes a process of forming an insulation material layer on the surface of a substrate. Examples of such a process include a step of laminating a photosensitive resist film, a photosensitive, or a thermosetting interlayer insulation material film on the surface of the substrate. The surface portion of the insulation material layer is, for example, covered with a carrier film made from PET (polyethylene terephthalate). Each carrier film is laminated on the main surfaces of each substrate. Therefore, it is necessary to peel the carrier film from the surface of the insulation material layer prior to processing the bonded insulation material layer.

Further, as another example of the process for forming the insulation material layer on the surface of the substrate, there is a process that forms the insulation material layer by repeating an application and a drying process of a liquid resist to the surface of the substrate. Since the surface portion of the insulation material layer may be adhesive to some degree even after being dried, it is necessary to cover it with, for example, a protective film made from PET etc. Similar to the carrier film, each protective film is also laminated on the main surfaces of each substrate. Therefore, similar to the case of peeling the carrier film, it is necessary to peel the protective film from the surface of the insulation material layer beforehand in order to develop the insulation material layer after exposure thereof.

As a conventional method for peeling such a carrier film or a protective film, for example, to form a floating part on the film, it is suggested that the film be scratched (e.g., see Patent Document 1) by moving the film in a surface direction of the film while rotating a knurling roll. Further, another proposed method is for a film pressing member to be moved along the surface direction of a film so as to lift the film to thereby form a floating part thereon (e.g., see Patent Document 2).

[Patent Document 1] Japanese Patent Application Laid-Open (kokai) No. 2000-86080 (FIG. 1 etc.)

[Patent Document 2] Japanese Patent Application Laid-Open (kokai) No. H10-324454 (FIG. 2 etc.)

3. Problems to be Solved by the Invention:

However, since it would be necessary to perform a peeling operation the same number of times as the number of substrates (and twice the number when films are laminated on both sides of a substrate) when a film provided on the substrate is to be peeled, efficiency of the peeling operation cannot be improved upon. Further, since the quantity of peeled films will be the same as the number of substrates or greater, the collection of separated films will be complicated.

Still further, if an excessive force is applied to a film when a knurling roll or a film pressing member is moved, it will lower yield due to the high probability that an insulation material layer or the substrate might be damaged. Still even further, the insulation material layer is formed of a fragile material which is easily damaged, even by a little scratch. Thus, a part of the insulation material layer is likely to collapse and become debris, thereby creating foreign particles. Moreover, if the foreign particles adhere to the insulation material layer, the thickness of the insulation material layer will not be uniform, which will also be a factor leading to lowering of yield.

SUMMARY OF THE INVENTION

The present invention has been accomplished in view of such problems. A first object of the present invention is to provide a method for manufacturing a wiring board that may achieve efficient peeling and collecting operations of protective films while preventing lowering of yield. A second purpose of the present invention is to offer a film peeling apparatus that may be capable of conducting the efficient peeling and collecting operations of the protective films while preventing lowering of yield.

Means for solving the above problems (Means 1) include an apparatus for use in peeling a protective film from a substrate having an insulation material layer protected by the protective film, wherein the film peeling apparatus comprises: a peeling opportunity portion formation means which forms a peeling opportunity portion on the periphery of said protective film in order to peel said protective film; a substrate support means which supports a plurality of adjoining substrates; a taping means which affixes a flexible tape so that each said protective film is connected at the peeling opportunity portion on a substrate being supported by said substrate support means; and a peeling mechanism which can continuously peel said protective films connected by said tapes by means of lifting them sequentially via said tape.

Thus, in the film peeling apparatus of Means 1, each protective film is connected by the tape according to the taping means. Then, the peeling mechanism sequentially lifts the protective film via the tape so as to continuously peel the protective film. Therefore, since the peeling operation may be implemented to a plurality of the substrates and the protective films may be peeled collectively, the peeling operation of the protective films may be performed efficiently. Furthermore, since the protective films are connected to each other by the tape, a plurality of the protective films may be collectively removed, such that efficient operation may be facilitated.

Furthermore, in this apparatus, since the peeling operation is performed after affixing the tape according to the taping means, the insulation material layer or the substrate is unlikely to be damaged by the peeling operation of the protective film, such that the lowering of yield may be prevented. Moreover, the less damage there is to the insulation material layer, the fewer particles that may be generated due to a collapse of a part of the insulation material layer. Therefore, lowered yield as a result of particles affecting the insulation material layer may also be prevented.

Further, the protective film can be easily peeled, starting from the peeling opportunity portion, by the peeling mechanism because the tape is affixed so that the protective films may be connected in the peeling opportunity portion.

Suitable materials for constituting the protective film are resin, paper, etc. which may have flexibility. Such materials may be appropriately chosen considering that they should cause minimal damage to the insulation material layer, their cost is reasonable, and they should have durability when thinly formed, etc. Some examples of the resin material used for the protective film are PET resin (polyethylene terephthalate resin), EP resin (epoxy resin), PI resin (polyimide resin), etc. In addition, although the thickness of the protective film is not particularly limited, a thickness of, for example, 15 μm or more to 50 μm or less may be preferable. Thus, the protective film can by easily peeled. If the thickness of the protective film is less than 15 μm, a portion thereof is likely to remain on the insulation material layer because it may possibly be torn when peeled. On the other hand, if the thickness of the protective film is greater than 50 μm, the flexibility thereof may be impaired, thereby possibly causing difficulty in removing the protective film. Moreover, when the protective film is coiled around the core body, the outer diameter of the core body where the protective film is coiled tends to increase, which may necessitate frequent exchange of the core body.

In addition, the peeling opportunity portion formed in the periphery of the protective film is preferably a plurality of through-holes penetrating the protective film. In this case, since an air pocket may be formed around the through-holes, an adhesive force may not act between the portion where the air pocket is formed and the substrate. Therefore, the protective film can be easily peeled, starting from the air pocket, by the peeling mechanism.

In addition, although the inner diameter of the through-hole is not specifically limited, the inner diameter thereof is, for example, preferably in the range of 0.1 mm or more to 1.5 mm or less, and more preferably from 0.5 mm or more to 1.0 mm or less. If the diameter of the through-hole is 0.1 mm or less, the protective film may not be sufficiently peeled, starting from the air pocket, because only a small air pocket may be formed. When the diameter of the through-hole is 1.5 mm or more, cracks may possibly occur at the edge of the through-hole when forming the through-holes.

Furthermore, it is preferable for the through-holes to be disposed in a straight line along the edge of the protective film at the traveling direction side, as well as in a row perpendicular to the traveling direction of the substrate. If a plurality of the through-holes exists in two or more rows perpendicular to the traveling direction of the substrate, the portion constituting the wiring board in the insulation material layer may be damaged, because the area in which the insulation material layer and the substrate are damaged from the formation of the through-holes may be extended.

Notably, the distance between the centers of adjacent through-holes is preferably 1.0 mm or more to 10 mm or less, more preferably 2.5 mm or more to 7.5 mm or less. If the distance between such centers is less than 2.5 mm, it may be that only the portion where the air pocket is formed may be peeled and the rest may possibly remain on the insulation material layer. If the distance between such centers is longer than 7.5 mm, it may be difficult during the taping process to affix the tape to the whole portion where the air pocket is formed.

The substrate may be a substrate composed mainly of resin material or ceramic material. Some examples of such a substrate include EP resin (epoxy resin) substrate, PI resin (polyimide resin) substrate, BT resin (bismaleimide-triazine resin) substrate, PPE resin (polyphenylether resin) substrate, etc. In addition, a substrate composed of a composite material of these resins and organic fibers, such as glass fiber (glass woven fabric or non-woven glass fabric) and polyamide fiber, can be employed. Alternatively, a substrate may be composed of a resin-resin composite material formed such that thermosetting resin, such as epoxy resin, is impregnated with three dimensional mesh-like fluorocarbon resin base material, such as continuous porosity PTFE. Moreover, an example of a substrate composed mainly of ceramic materials is a substrate composed of a ceramic material, such as alumina, aluminum nitride, boron nitride, silicon carbide, and silicon nitride.

Further, the substrate has a generally rectangular shape with four sides preferably having lengths of 60 cm or less. If the length is greater than 60 cm, the total amount of protective films removed from the substrates may become so large that the rolling up and collection of the protective films may not be easy. Also, even though the protective films are connected by the tapes, it may be difficult to peel them continuously.

The substrate support means may include members, such as rollers, conveying the substrate while supporting the substrate in a generally horizontal position. In the substrate support means, a support unit for supporting the substrate is preferably prepared only when a plurality of the substrates is adjoined (i.e., only when positioning the substrate). A specific example for the mechanism supporting the substrate is an actuator etc., in which the support unit is lifted upward so as to contact the substrate when positioning the substrate, while the support unit is moved downward so as to be separated from the substrate when not positioning the substrate. In this way, an accurate positioning of the substrate may be facilitated because the support unit supports the substrate at the time of positioning. Moreover, when not positioning the substrate (for example, when the substrate is transferred to a back-end process), the support unit may not interfere with the substrate through contact. Thus, the substrates can be transferred smoothly.

Suitable materials used for the tape include resin, paper, etc. Such materials may be chosen in consideration of their flexibility etc. If a material with no flexibility is employed, difficulty in correctly rolling up and collecting the protective films connected by the tapes may result. Also, when it is thinly formed, the cost and the durability, etc. of the materials may be considered. Some examples of the resin materials used for the base material of the tape include PET resin (polyethylene terephthalate resin), PVC resin (polyvinyl chloride resin), EP resin (epoxy resin), PI resin (polyimide resin), etc. In addition, if the base material of the tape is formed of the same material as the protective film, it may facilitate segregation and reuse of the material.

Moreover, the tape affixed in the taping process can have an adhesive layer on the reverse side of the base material or not. However, the tape preferably has an adhesive layer. In this way, since it is not required to have an adhesive material applied to the reverse side of the tape when affixing, the taping process can be conducted efficiently. Also, as heat treatment is not necessary when affixing the tape, any adverse effect on the insulation material layer caused by heat may not be experienced, such that a lowered yield may be avoided.

Some examples of a tape (adhesive tape) having an adhesive layer include cellophane tape, vinyl tape, aluminum tape, etc. Specifically, cellophane tape may cause little damage to the substrate it is relatively cheap, and it may be durable when thinly formed. On the other hand, an example of a tape not having an adhesive layer can be paper tape etc.

In addition, in the taping means, the tape may be affixed not only to the periphery of the protective film, but also in such a manner that the tape can reach the central part thereof. However, the tape is preferably affixed only to the periphery of the protective film. In this way, since a long tape is not required for connecting the protective films, the amount of tape used can be reduced. Moreover, in the taping means, it is preferable to affix the tape to the portion where the peeling opportunity portion is formed, specifically, the portion where the air pocket is formed around the through-holes. In this way, the protective film may be peeled, starting from the air pocket where adhesion with the substrate may not exist, such that the peeling operation may be facilitated.

Moreover, the taping means preferably comprises: a tape supplying means which lets out the tape; a tape cutting means which cuts the tape supplied by the tape supplying means; and a tape pressing means which presses the tape supplied by the tape supplying means against the edge of the substrate.

The tape supplying means in the peripheral portion of the protective film may let out the tape along the direction perpendicular to the traveling direction of the substrate or along the traveling direction of the substrate. However, it is preferable that the tape is let out along the traveling direction of the substrate. In this way, since a long tape is not required for connecting the protective films, the amount of tape used can be reduced. In addition, when letting out the tape along the traveling direction of the substrate, the tape is preferably affixed to two or more locations in connecting the protective films. If the protective film is connected by a tape affixed to only one location, tension may concentrate thereon when the protective film is lifted via the tape. This may cause a separation or breaking of the tape, thereby increasing the probability of a separation of the protective film.

The peeling mechanism preferably comprises: a pulling means which pulls the protective film in the direction that the protective film connected by the tape is lifted; a guide roller positioned so as to touch the protective film, which has not been peeled, provided on the substrate, which guides the protective film to the pulling means side along the periphery of the guide roller; and a guide roller positioning mechanism which positions the guide roller so that a rotation axis of the guide roller may be located near the center of the substrate rather than the edge thereof.

Since the guide roller is located so as to touch the protective film, the substrate can be protected from being lifted when the protective film is raised. Therefore, the substrate from which the protective film has been removed can be assuredly conveyed to the back-end process. Moreover, if the guide roller is positioned so that the rotation axis of the guide roller may be located outward of the edge of the substrate rather than the edge thereof, some portions of the protective film may remain on the substrate. On the other hand, according to the present invention, the guide roller is positioned by the guide roller positioning mechanism so that the rotation axis of the guide roller may be positioned near the center of the substrate rather than the edge thereof. In this case, the protective film can be assuredly peeled from the substrate.

Further, the film peeling apparatus preferably comprises: a substrate position detection means to detect the position of the edge of the substrate in the substrate support means; and a substrate location means which locates the substrate based on the detection result from said substrate position detection means where a clearance is provided between the edges of the substrates. This is because the protective film might be hidden under the substrate bottom that makes the peeling process difficult, when the protective film overlaps the perimeter of the substrate and the edges thereof touch each other. Furthermore, in this way, since the substrate location means adjusts the position of the substrate based on the detection result from said substrate position detection means, the clearance between the edges of the substrates can be assuredly provided.

Moreover, the film peeling apparatus preferably comprises a film rolling-up means to roll up and collect the protective film peeled by the peeling mechanism. If the protective film, which has been peeled, is dropped into a dustbin, the collected protective films may be bulky, such that a problem with disposal of the protective films may be created. On the other hand, in the film peeling mechanism in the present invention, the protective films may be compactly rolled up for collection, making for ease of disposal.

The film rolling-up means preferably comprises: a core body where the protective film peeled by the peeling mechanism is coiled; a core body support means which supports said core body so as to be rotatable; a core body drive means which drives said core body rotationally; and a clutch mechanism which adjusts the transferred amount of rotational driving force between said core body and said core body drive means. In this way, the protective films are coiled around the core body, and if the outer diameter of the core body where the protective film is coiled becomes great, the rotational speed of the core body can be reduced by lowering the transferred amount of rotational driving force with the clutch mechanism. Thus, the peripheral speed of the protective film can be maintained at the same level as the speed with which the protective film is peeled by the peeling mechanism. Therefore, a disconnection of the tape due to an accelerated peripheral speed of the protective film may be prevented.

In addition, the core body is preferably supported so as to be detachable from the core body support means. In this way, for example, where the protective films are coiled around the core body and the core body reaches a limit, collection of the protective films may smoothly continue by exchanging the core body.

Suitable materials for the core body may be composed of metal, resin, paper, etc. Specifically, resin, paper, etc. may be easy to discard. Furthermore, if the core body is formed of the same material as the protective film, segregation and reuse of the material may be facilitated. Some examples of the resin materials used for the core body include PET resin (polyethylene terephthalate resin), EP resin (epoxy resin), PI resin (polyimide resin), etc.

Further, when the protective film is provided on both sides of the substrate, it is preferable to have a reversal mechanism that reverses the substrate after peeling any one of the protective films. In this case, if the substrate where one of the sides of the protective film is peeled is reversed by the reversal mechanism, the peeling operation can be conducted to the protective film provided on the other side of the substrate, thereby peeling both protective films. Moreover, the protective films provided on both sides of the substrate can be peeled without changing the location mode, such as the taping means and the peeling mechanism. In addition, the film peeling apparatus preferably comprises a substrate return mechanism which returns the substrate reversed by the reversal mechanism to the taping means. In this way, only one set of the taping means, the peeling mechanism, etc. may be required, when the peeling of the protective films provided on both sides of the substrate is necessary.

Further, means for solving the above problems (Means 2) is a method for manufacturing a wiring board through a process that peels a protective film from a substrate having an insulation material layer protected by the protective film, wherein the method comprises: a taping process which supports a plurality of the substrates adjoined under the condition that the edges of the substrates are placed close to each other, and which affixes the flexible tape to the edge of the substrate at more than one location so as to connect the protective films; and a peeling process which continuously peels the protective films connected to each other by lifting them sequentially via each tape following the taping process so that the insulation material layer may remain on the substrate.

Therefore, according to the taping process, the protective film is connected by the tape according to the method of Means 2. Then, in the peeling process, the protective films are sequentially lifted via the tapes so as to be peeled continuously. Therefore, if the peeling operation is conducted on a plurality of the substrates in order to collectively peel the protective films, the peeling operation can be performed efficiently. Moreover, since the protective films are connected to each other by the tapes, a plurality of the protective films can be collectively removed, such that an efficient collecting operation thereof may be facilitated.

Furthermore, in the manufacturing method of Means 2, the peeling operation is performed after affixing the tape according to the taping process. Therefore, the insulation material layer or the substrate is unlikely to be damaged due to the peeling operation of the protective film, such that a lowered yield may be prevented. Moreover, the less damage there is to the insulation material layer, the fewer particles that may be generated due to a collapse of the partial insulation material layer. Thus, a lowered yield resulting from particles affecting an insulation material layer may also be prevented.

Further, means for solving the above problems (Means 3) is a method for manufacturing a wiring board through a process that peels a protective film from a substrate having an insulation material layer protected by the protective film, wherein the method comprises: a peeling opportunity portion formation process which forms the peeling opportunity portion on the periphery of the protective film; a taping process which supports a plurality of the substrates adjoined under the condition where the edges of the substrates are placed close to each other following the peeling opportunity portion formation process, and which affixes a flexible tape so that the protective films are connected in the peeling opportunity portions; and a peeling process which continuously peels the protective films connected to each other by lifting them sequentially via the tapes after the taping process so that the insulation material layer may remain on the substrate.

Further, means for solving the above problems (Means 4) is a method for manufacturing a wiring board through a process that peels a protective film from a substrate having an insulation material layer protected by the protective film, wherein the method comprises: a through-hole formation process which forms through-holes provided in the periphery of the protective film by piercing with, for example, needles; a taping process which supports a plurality of the substrates adjoined under the condition where edges of the substrates are placed close to each other following the through-hole formation process, and which affixes a flexible tape so that the protective films are connected in an air pocket region formed around the through-holes; and a peeling process which continuously peels the protective films connected to each other by lifting them sequentially via the tapes and leaves the insulation material layer on the substrate after the taping process.

Next, as an example of using the film peeling apparatus described above, a method for manufacturing a wiring board using the film peeling apparatus is shown below.

For example, a substrate having an insulation material layer protected by a protective film is conveyed, and then a peeling opportunity portion formation process which forms the peeling opportunity portion serving as an opportunity to peel the protective film on the periphery thereof may preferably be conducted. An example of the peeling opportunity portion formation process is a through-hole formation process forming through-holes by piercing the periphery of the protective film with needles. In this case, since an air pocket may be formed around the through-holes, an adhesive force may not act between the portion where the air pocket is formed and the substrate. Therefore, the protective film can be easily peeled, starting from the air pocket, by the peeling mechanism.

The taping process is carried out after the through-hole formation process. Specifically, a plurality of the substrates first may be located so as to be adjoined while providing a clearance between the edges of the substrates. Then, a flexible tape is affixed so that the protective films may be connected.

In addition, the taping process preferably includes a tape supplying process which lets out the tape on the protective film, a tape cutting process which cuts the tape supplied after the tape supplying process, and a tape pressing process which presses the tape supplied following the tape supplying process against the edge of the substrate. In detail, the tape cutting process which cuts the supplied tape may be carried out after the tape supplying process, and then the tape pressing process which presses the supplied tape against the edge of the substrate may be conducted. Thus, the tape is affixed so as to connect the protective films. In addition, the tape pressing process may be conducted following the tape supplying process, and after that the tape cutting process may be conducted.

In the tape supplying process, the tape may be let out along the direction perpendicular to the traveling direction of the substrate or along the traveling direction of the substrate in the peripheral portion of the protective film. However, it is preferable that the tape is let out along the traveling direction of the substrate. In this way, since a long tape is not required for connecting the protective films, the amount of tape used can be reduced. In addition, when letting out the tape along the traveling direction of the substrate, the tape is preferably affixed to the edge of the substrate at two or more locations in connecting the protective films. If the protective films are connected by the tape affixed to only one location on the edge of the substrate, tension may concentrate thereon when the protective film is lifted via the tape. This may cause separation or a breaking of the tape, such that the probability of the protective films separating may increase.

In addition, in the taping process, the tape may be affixed not only to the periphery of the protective film, but also so as to reach the central part thereof. However, the tape is preferably affixed only to the periphery of the protective film. In this way, since a long tape is not required for connecting the protective films, the amount of tape used may be reduced. Moreover, in the taping process, it is preferable to affix the tape to the portion where an air pocket is formed around the through-holes. In this way, the protective film may be peeled, starting from the air pocket where adhesion with the substrate may not exist, such that the peeling operation may be facilitated.

Further, in the taping process, it is preferable that the tape is affixed after a plurality of the substrates is supported and adjoined under the condition where the edges of the substrates are positioned so as oppose to each other. Specifically, the tape is preferably affixed under the condition that a plurality of the substrates is supported and the edges thereof are placed close to each other. Furthermore, the tape is preferably affixed after providing a clearance between edges of the substrates. If the protective film overlaps the perimeter of the substrate, which may cause the edges of the substrates to touch each other, the protective film might be hidden under the substrate, such that the peeling operation may be complicated.

In addition, the substrate is usually conveyed continuously. In such a case, the size of the clearance between the substrates is preferably from 0.7 mm or more to 1.3 mm or less. When the clearance is 0.7 mm or less, the probability that the protective film may be hidden under the substrate may increase. On the other hand, when the clearance is 1.3 mm or more, longer tape may be required to connect the protective films. Therefore, cost may increase due to an increase in the amount of tape used. Moreover, since a weak section (a section where only the tape exists) may be lengthened when the protective films are connected, the tape may be easily torn. In addition, when the substrate is not conveyed continuously, the distance between the substrates is preferably established below the length of the side (parallel to the traveling direction) of the substrate (for example, 60 cm).

After the taping process, the peeling process which continuously peels the protective films connected to each other by lifting them sequentially via the tape may be conducted in order to leave the insulation material layer on the substrate. In the peeling process, the guide roller may be positioned so as to touch the protective film, which has not been peeled, provided on the substrate, and the rotation axis of the guide roller may be located near the center of the substrate rather than the edge thereof. Then, the protective film connected by the tape may be pulled along the peripheral surface of the guide roller. In this way, the protective film may be easily peeled by the peeling mechanism. Moreover, since the peeling process does not require any heat treatment to the protective film, the denaturation (e.g., thermal hardening) of the insulation material layer can be prevented beforehand.

In the peeling process, while the guide roller is located so as to touch the protective film, which has not been peeled, provided on the substrate, and the rotation axis of the guide roller is located near the center of the substrate rather than the edge thereof, the protective film connected by the tape is preferably pulled along the peripheral surface of the guide roller.

In this way, the substrate may be prevented from floating at the time of lifting the protective film, because the guide roller is positioned so as to touch the protective film. Therefore, the substrate where the protective film is removed can be assuredly conveyed to the back-end process. Moreover, if the rotation axis of the guide roller is positioned outward of the edge of the substrate, the protective film may not be peeled completely and may remain on the substrate. On the other hand, according to the present invention, the rotation axis of the guide roller may be positioned near the center of the substrate rather than the edge thereof in the peeling process. In this case, the protective film can be assuredly peeled from the substrate.

In addition, the film rolling-up means which rolls up and collects the protective film, which has been peeled, is preferably conducted after the peeling process. If the protective film, which has been peeled, is dropped into a dustbin, the protective films disposed of may be bulky, such that a problem with disposal of the protective films may be created. On the other hand, according to the present invention, the protective films may be compactly rolled up for collection, such that the amount of waste may be reduced.

Furthermore, the taping process may be conducted prior to the through-hole formation process. That is, after the taping process, through-holes may be formed during the through-hole formation process by piercing the portion where the tape is supposed to be affixed with, for example, needles, the peeling process may be conducted.

According to such a manufacturing method, the protective film is likely to be peeled, thus, the wiring board can be manufactured efficiently.

In addition, the wiring board may be a build-up multilayer wiring board having a build-up layer composed of a plurality of interlayer insulation layers and a plurality of conductive layers, alternately laminated, wherein the insulation material layers may be used for forming the interlayer insulation layers.

DESCRIPTION OF REFERENCE NUMERALS

Figure 1:
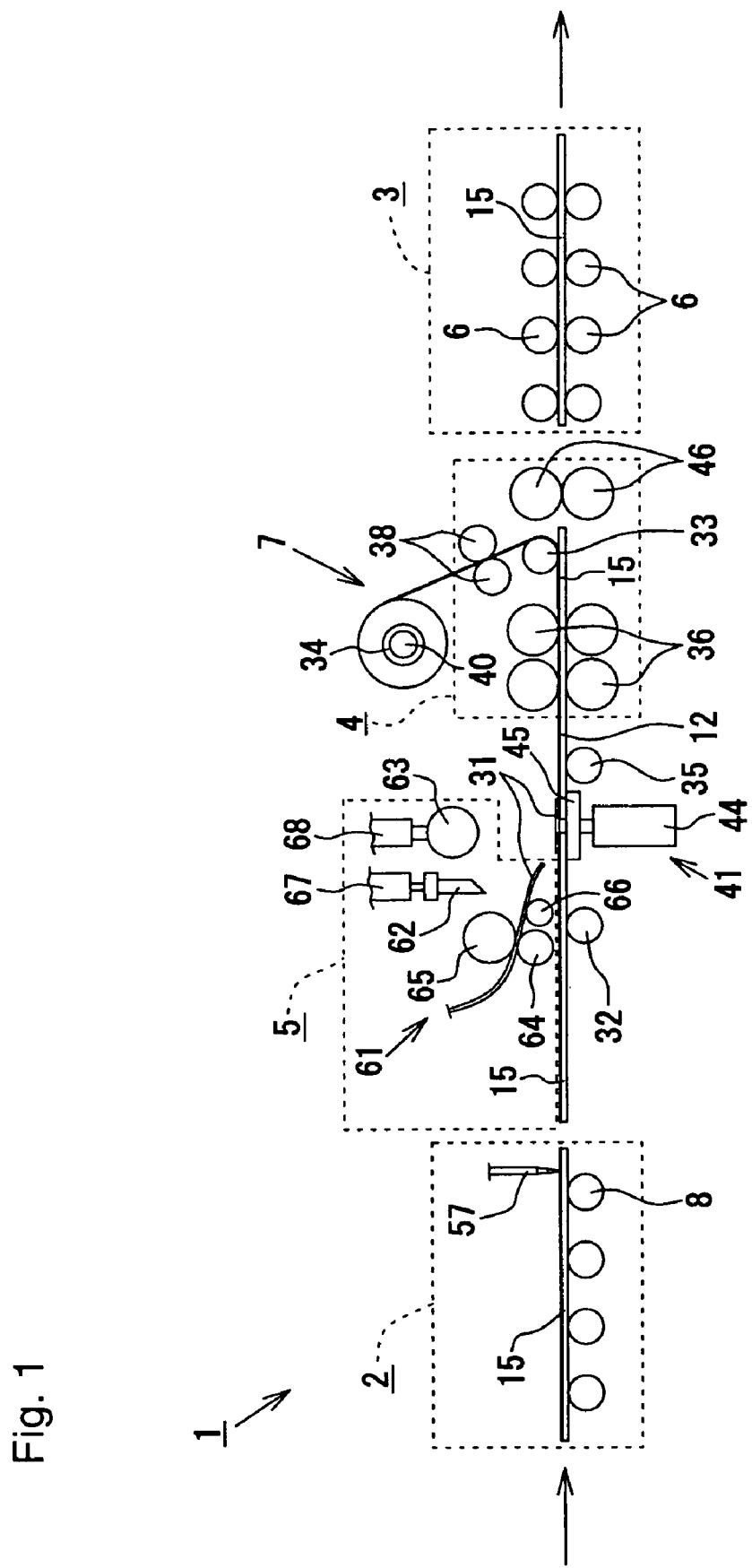
FIG. 1 is a schematic view showing a film peeling apparatus according to an embodiment.

Reference numerals used to identify various structural features in the drawings include the following.
1—film peeling apparatus
4—film peeling mechanism serving as peeling mechanism
5—taping mechanism serving as taping means
7—film rolling-up mechanism serving as film rolling-up means
12—protective film
14—interlayer insulation material serving as insulation material layer
15—substrate
16—through-holes serving as peeling opportunity portion
17—air pocket
18, 19—edge of the substrate
20—clearance
31—tape
33—guide roller
34—paper tube serving as core body
38—pulling roller serving as pulling means
39—motor for driving paper tube serving core body drive means
40—paper tube support axis serving as core body support means
41—substrate support portion serving as substrate support means
57—needle serving as peeling opportunity portion formation means
61—tape supply mechanism serving as tape supply means
62—tape cutter serving as tape cutting means
63—tape pressing roller serving as tape pressing means
71, 72—substrate position detection sensor serving as substrate position detection means
81—clutch mechanism
S1—through-hole formation process serving as peeling opportunity portion formation process
S2—taping process
S3—peeling process
S4—protective film collection process

DETAILED DESCRIPTION OF THE PREFERRED EMBODIMENTS

Hereinafter, an explanation will be given in detail regarding a film peeling apparatus for manufacturing a wiring board according to a preferred embodiment with reference to FIGS. 1 to 10.

FIG. 1 shows a general film peeling apparatus 1 according to a preferred embodiment. This film peeling apparatus 1 includes a film piercing mechanism 2, a taping mechanism 5 (taping means), a film peeling mechanism 4 (the peeling mechanism), and a substrate discharge mechanism 3. The film piercing mechanism 2 conveys a substrate 15 to the taping mechanism 5, after forming through-holes 16 in a protective film 12 of the substrate 15 having an interlayer insulation material 14 (insulation material layer) protected by the protective film 12 (see FIG. 4). The taping mechanism 5 conveys the substrates 15 to the film peeling mechanism 4, after affixing the flexible tapes 31 so that the protective films 12 of the substrates 15 may be connected to each other. The film peeling mechanism 4 conveys the substrates 15 to the substrate discharge mechanism 3 after continuously peeling the protective films 12 via the tapes 31 by sequentially lifting the protective films 12 connected by the tapes 31. The substrate discharge mechanism 3 discharges the substrate 15 that has completed the peeling process of the film peeling mechanism 4 from the film peeling apparatus 1. This film peeling apparatus 1 is used when a build-up multilayer resin wiring board (wiring board) is manufactured by way of forming build-up layers on the substrate 15. In addition, the build-up layers may be formed of a plurality of interlayer insulation layers and a plurality of conductive layers, alternately laminated.

Figure 2:
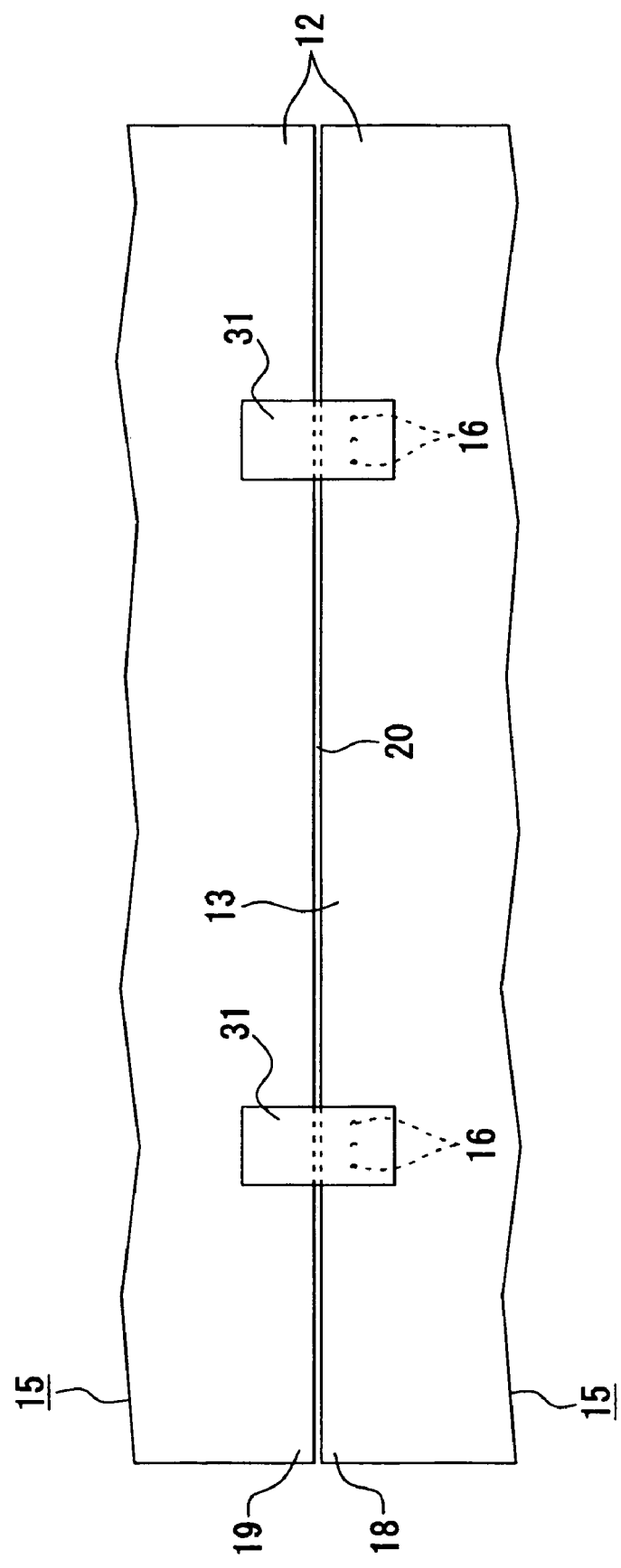
FIG. 2 is a top surface view of the relevant part showing a substrate having an interlayer insulation material protected by a protective film.
Figure 3:
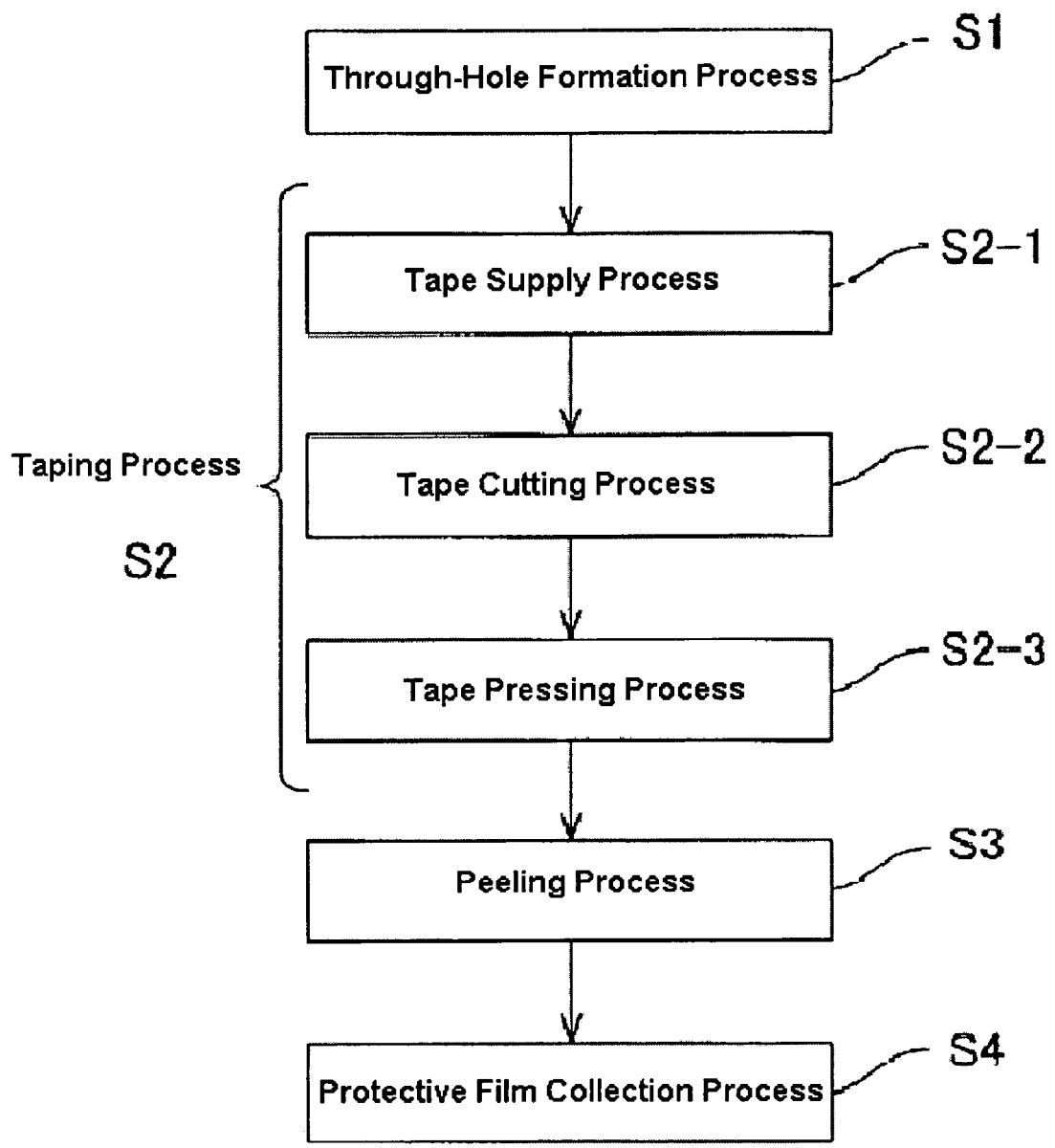
FIG. 3 is a flow chart showing the outline of the manufacturing process of a wiring board.
Figure 4:
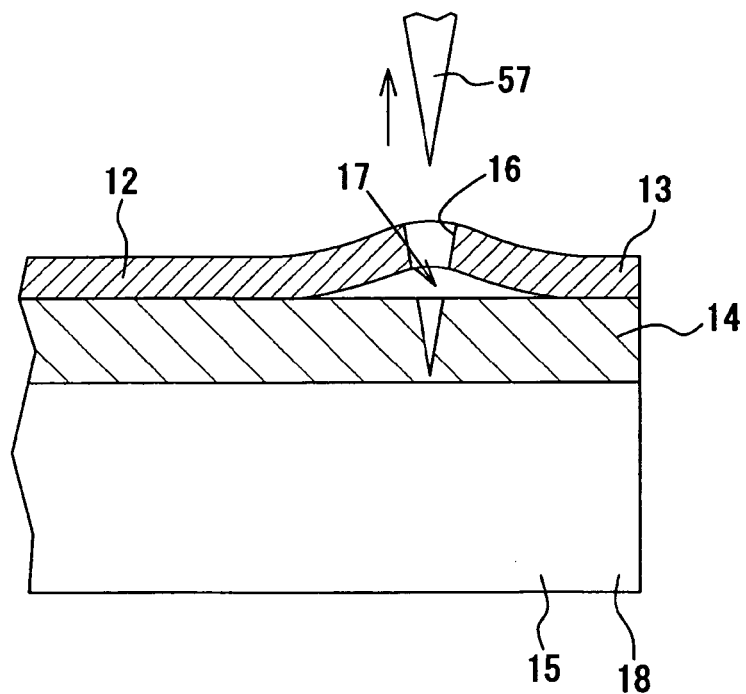
FIG. 4 is a sectional view of the relevant part showing a state after pulling out needles from the protective film.

FIG. 2 and FIG. 4 show the substrate 15 which is the operational object of the peeling apparatus 1. The substrate 15 is a core substrate of a build-up multilayer resin wiring board and, for example, a substrate having conductive layers provided on both sides thereof is employed. On the entire upper surface of the substrate 15, the interlayer insulation material 14 is provided. This interlayer insulation material 14 is composed of, for example, a photosensitive epoxy resin. Furthermore, the surface portion of the interlayer insulation material 14 is protected by a protective film 12 made from, for example, PET (polyethylene terephthalate). With certain embodiments, the thickness of the protective film 12 may be about 25 μm. Moreover, a plurality of through-holes 16 (peeling opportunity portion), used as an opportunity to peel the protective film 12, is formed on the side edge of the periphery portion of the protective film 12 in a traveling direction of the substrate. In certain embodiments, the diameter of the through-hole 16 may be about 1.0 mm, and the distance between the centers of adjacent through-holes 16 may be about 3 mm. Also, the distance between the through-hole 16 and the side edge of the substrate 15 in the traveling direction may be about 6 mm. In addition, each through-hole 16 is disposed in a straight line along the edge portion 13 of the protective film 12 in the traveling direction. Moreover, each through-hole 16 is provided in one row perpendicular to the traveling direction of the substrate 15. These through-holes 16 correspond to the positions of needles 57 in the film piercing mechanism 2.

As shown in FIG. 1, the film piercing mechanism 2 comprises a plurality of substrate support rollers 8, the needles 57, etc. The substrate support rollers 8 support the substrate 15 from the bottom, and rotate in connection with the movement of the substrate 15. The needles 57 (peeling opportunity portion formation means) are for piercing the peripheral portion of the protective film 12 to form the through-holes 16. When the needles 57 are pulled out from the protective film 12, an air pocket 17 will be formed around the through-holes 16 provided in the protective film 12 (refer to FIGS. 4 to 8).

As shown in FIGS. 1, 2, 6, and 7, in the taping mechanism 5, a tape 31 is affixed to two locations respectively having some distance from each other on the protective film 12 so that the protective films 12 are connected at between an edge 18 of the substrate 15 and an edge 19 of another substrate 15 positioned in the traveling direction. That is to say, the taping mechanism 5 affixes the tape 31 such that the portion where the air pocket 17 is formed in the protective film 12 and the peripheral portion of the protective film 12 of another substrate 15 positioned in the traveling direction may be connected. The tape 31 of certain embodiments employs an adhesive tape having an adhesive layer on its reverse side.

As shown in FIG. 1, the taping mechanism 5 comprises a tape supply mechanism 61 (tape supply means). The tape supply mechanism 61 includes a tape supply roller 64, a rubber roller 65, and a tape guidance roller 66. The tape supply roller 64 rotated by a motor for tape supply (no illustration provided) lets out the tape 31 along the traveling direction of the substrate 15. In addition, a plurality of uneven portions are prepared on the periphery surface of the tape supply roller 64 so as to touch the reverse side (adhesive layer side) of the tape 31. Thus, the contact surface of the tape supply roller 64 and the tape 31 is small, such that the tape 31 may be prevented from sticking to the tape supply roller 64. Further, the rubber roller 65 touches the surface of the tape 31 and rotates in connection with the supply of the tape 31. In addition, the tape 31 is held tight by the rubber roller 65 and the tape supply roller 64. Moreover, the tape guidance roller 66 touches the reverse side of the tape 31 and rotates in connection with the supply of the tape 31. Then, the tape guidance roller 66 guides the tape 31 supplied by the tape supply roller 64 to the substrate 15.

Further, the taping mechanism 5 shown in FIG. 1 includes a tape cutter 62 (tape cutting means) and a tape pressing roller 63 (tape pressing means). The tape cutter 62 is attached at the front end of a rod on an air cylinder 67. The tape cutter 62 moves up and down by the air cylinder 67, and cuts the tape 31 supplied by the tape supply roller 64 (see FIG. 6). Moreover, the tape pressing roller 63 is attached at the front end of a rod on an air cylinder 68, and moves up and down by the air cylinder 68. While the tape pressing roller 63 touches the surface of the tape 31 supplied by the tape supply roller 64, it rotates and moves along the traveling direction of the substrate 15 (the direction indicated with arrows F1 and F2) (see FIG. 7). Accordingly, the tape pressing roller 63 presses the tape 31 against the edges 18, 19 of the substrates 15.

As shown in FIG. 1, a substrate support portion 41 (substrate support means) for supporting the substrate 15 is formed between the taping mechanism 5 and the film peeling mechanism 4. The substrate support portion 41 includes a substrate conveyance roller 32, substrate support rollers 35, and a support stand 45. The substrate conveyance rollers 32, rotated by a motor for transferring a substrate (no illustration), conveys the supported substrate 15 to the film peeling mechanism 4. The substrate support rollers 35 support the substrate 15 from the bottom, and rotate in connection with the movement of the substrate 15. From below, the support stand 45 supports the edge 18 of the substrate 15 and the edge 19 of another substrate 15 in the traveling direction. That is, the support stand 45 supports two sheets of substrate 15 under the condition where the edges 18, 19 of the substrates 15 are placed close to each other. In other words, the support stand 45 supports two sheets of substrate 15 adjoined while providing a clearance, which is smaller than the length in the traveling direction of the substrate 15 (the side length parallel to the traveling direction of the substrate 15), between the edges 18, 19 of the substrates. The support stand 45 is attached at the front end of a rod on an air cylinder 44, and moves up and down by the air cylinder 44. When positioning the substrate 15, the air cylinder 44 moves the support stand 45 upward to support the edges 18, 19 of the substrates. Moreover, the air cylinder 44 moves the support stand 45 downward, when the substrate 15 is transferred.

Figure 5:
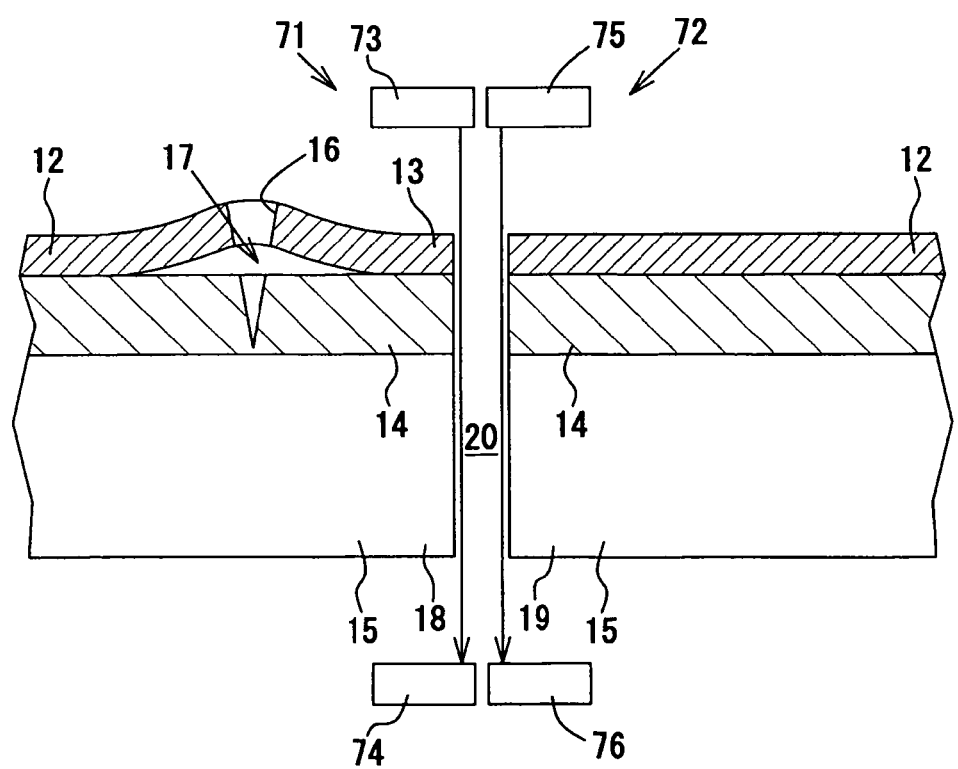
FIG. 5 is sectional view of the relevant part showing a state when the substrates are located adjacently.
Figure 6:
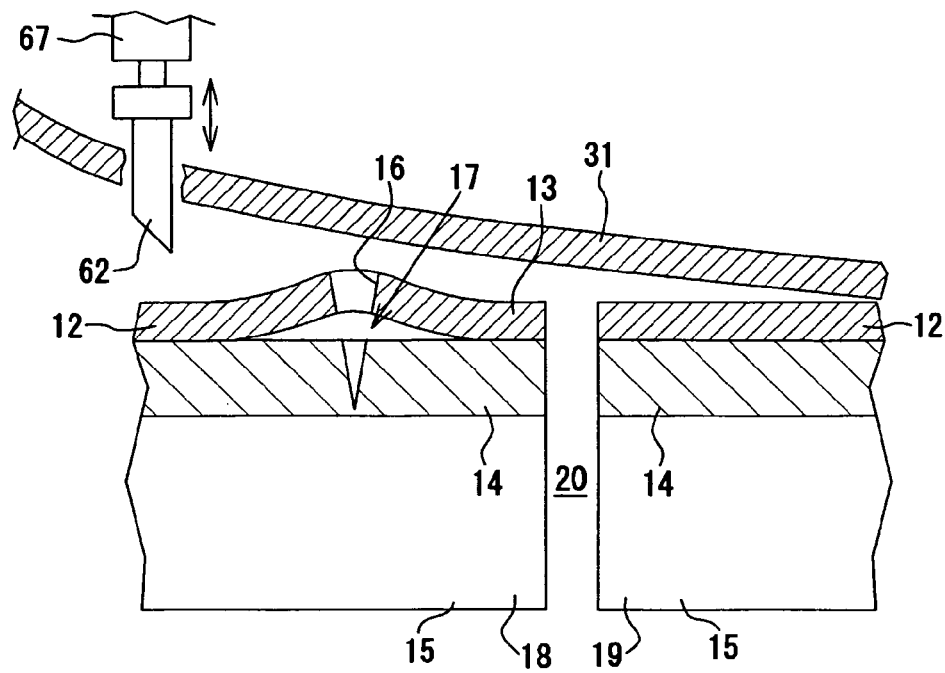
FIG. 6 is a sectional view of the relevant part showing a state when a supplied tape is cut by a tape cutter.
Figure 7:
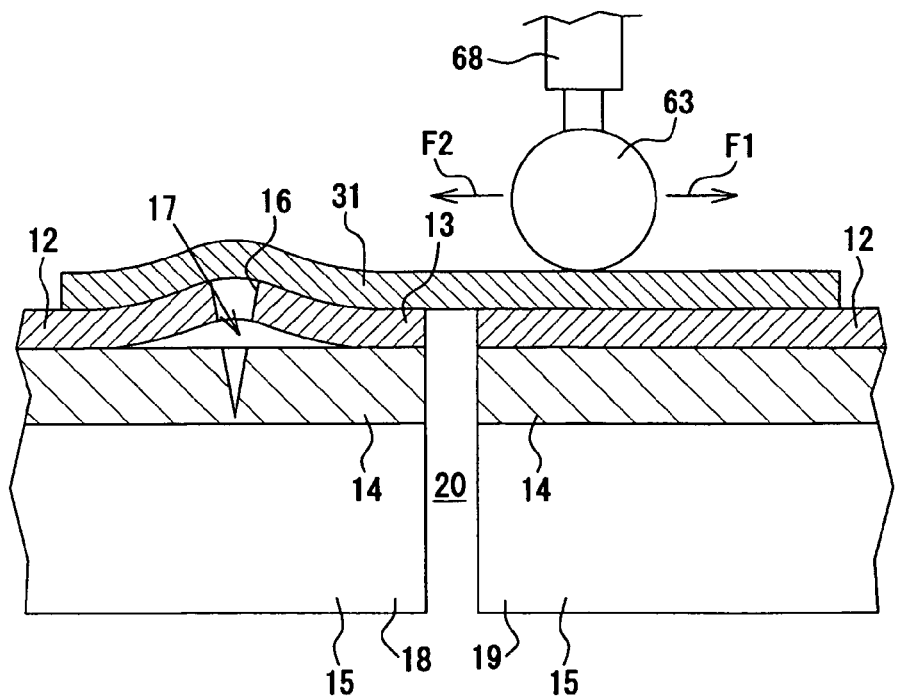
FIG. 7 is a sectional view of the relevant part showing a state when the tape is pressed with a tape pressing roller.
Figure 8:
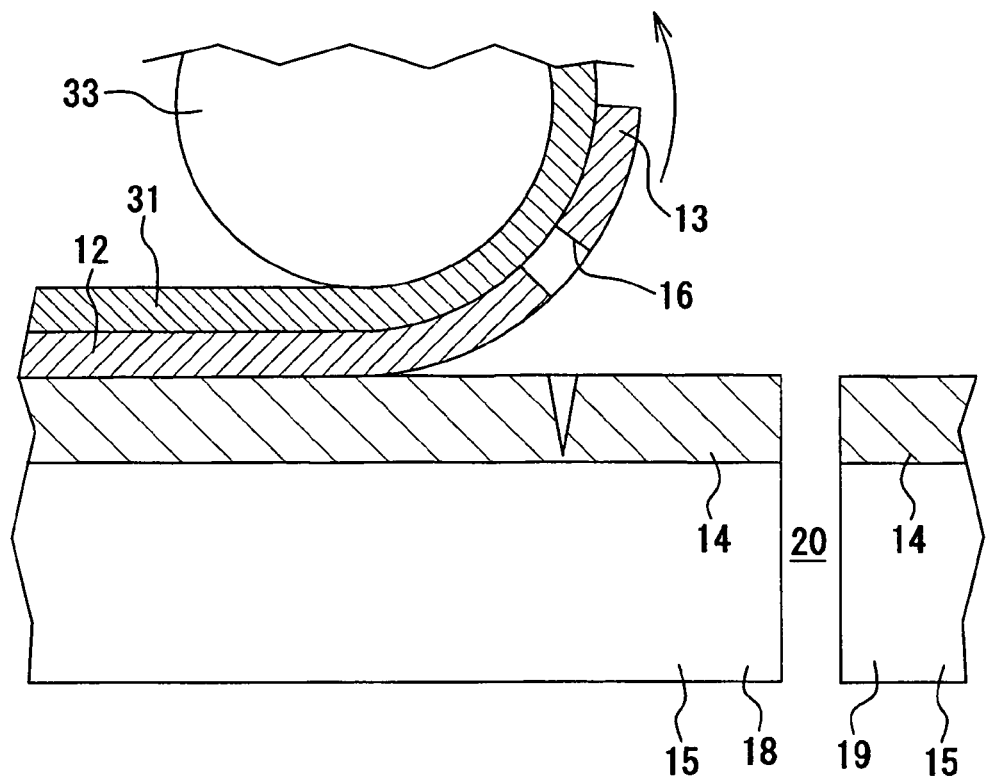
FIG. 8 is a sectional view of the relevant part showing a state when the protective film is peeled.
Figure 9:
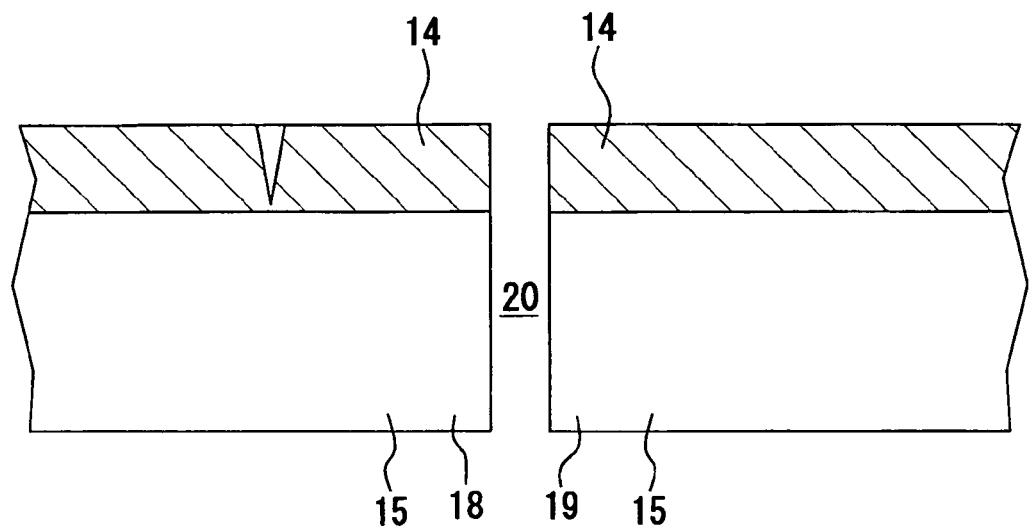
FIG. 9 is a sectional view of the relevant part showing the substrate after peeling the protective film.

Further, substrate position detection sensors 71, 72 are provided near the conveyance route of the substrate 15 (see FIG. 5). The substrate position detection sensor 71 comprises a light emitting portion 73 provided on the upper side of the conveyance route and a light receiving portion 74 provided on the bottom side of the conveyance route which detect whether the edge 18 of the substrate 15 at the traveling direction side has moved and reached a predetermined position or not. Also, the substrate position detection sensor 72 comprises a light emitting portion 75 and a light receiving portion 76 so as to detect whether the edge 19 of another substrate 15 positioned at the traveling direction side is situated in a predetermined position or not. In detail, the substrate position detection sensors 71, 72 detect as to whether the edges 18, 19 of the substrates are adjoined having a clearance 20 of about, for example, 1 mm therebetween or not.

The motor for transferring the substrate makes the substrate conveyance roller 32 rotate based on the detection result of the substrate position detection sensors 71, 72 in order to move the edge 18 of the substrate 15 so as to provide the clearance 20 between the edge 18 and the edge 19 of the substrates. Thus, the motor for transferring the substrate has a function serving as a substrate location means.

As shown in FIG. 1, the film peeling mechanism 4 is for peeling the protective film 12, starting from an air pocket. The film peeling mechanism 4 includes a plurality of substrate control rollers 36 and a pair of discharge rollers 46. Each substrate control roller 36 is provided so as to touch the top and bottom surfaces of the substrate 15 respectively, as well as holding the substrate 15 tight by an actuator (no illustration), such as an air cylinder. Each substrate control roller 36 rotates in connection with the movement of the substrate 15. Further, both discharge rollers 46 hold the substrate 15 tight from the top and bottom surfaces of the substrate 15 and rotate in connection with the movement thereof. Both discharge rollers 46 discharge the substrate 15 to the substrate transfer mechanism 3 side. In addition, the substrate transfer mechanism 3 is mainly constituted by a plurality of rubber rollers 6. The rubber rollers 6 hold the substrate 15 tight from the top and bottom surfaces of the substrate 15 and rotate in connection with the movement thereof.

Furthermore, the film peeling mechanism 4 shown in FIG. 1 includes a guide roller 33 and a pair of pulling rollers 38 (pulling means). At the front end of the substrate 15 (the edge in the traveling direction) conveyed by the film peeling mechanism 4, the guide roller 33 is located so as to touch the protective film 12, which has not been peeled, provided on the substrate 15. The guide roller 33 guides the protective film 12 to the pulling rollers 38 along the periphery of the guide roller 33. Both pulling rollers 38 hold the protective film 12 tight from the top and bottom surfaces thereof. Moreover, both pulling rollers 38 driven by the motor for pulling the protective film (no illustration) pull the protective film 12 in the direction which the protective film 12 connected by the tape 31 is lifted.

Figure 10:
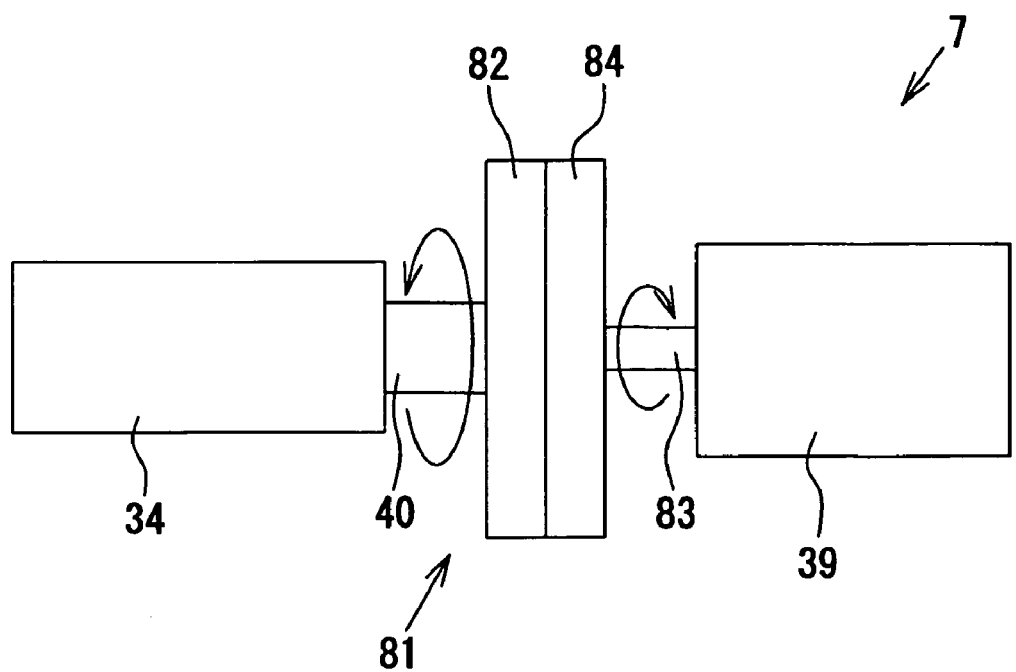
FIG. 10 is a schematic view showing a clutch mechanism according to another embodiment.

As shown in FIG. 1, the film peeling apparatus 1 comprises a film rolling-up mechanism 7 (film rolling-up means) which rolls up and collects the protective films 12 peeled by the film peeling mechanism 4. The film rolling-up mechanism 7 includes a paper tube 34 (core body) and a paper tube support axis 40 (core body support means). The paper tube support axis 40 supports the paper tube 34 that is detachable. In detail, the paper tube support axis 40 may be inserted into and removed from the center of the paper tube 34. Moreover, the inner diameter of the paper tube 34 may be almost equal to the outer diameter of the paper tube support axis 40 so that the paper tube 34 and the paper tube support axis 40 may not do relative rotation. The paper tube support axis 40 is rotated by a motor for driving the paper tube 39 (core body drive means) as shown in FIG. 10. Accordingly, the protective film 12 is coiled around the paper tube 34.

Next, a method for manufacturing a build-up multilayer resin wiring board using the film peeling apparatus 1 is explained.

First, a copper-clad laminate is subjected to a punching process using a drill machine in order to form through-holes (no illustration) penetrating the copper-clad laminate at predetermined positions. In addition, the through-holes may be formed in the copper-clad laminate by, for example, a laser punching process using a YAG laser or a carbon dioxide gas laser. Then, the through-holes may be formed by conducting, for example, electroless copper plating and electolytic copper plating according to, for example, a conventionally known technique. Further, both sides of the copper-clad laminate having copper foil thereon may be etched in order to pattern a first conductive layer by, for example, a subtractive method. Specifically, the electrolytic copper plating may be applied to the electroless copper plating layer serving as a common electrode after conducting the electroless copper plating. Furthermore, a dry film may be laminated and formed in a predetermined pattern by performing exposure and development processes. In this state, an unnecessary electrolytic copper plating layer, a non-electrolyzed copper plating layer, and a copper foil may be removed by etching. Then, the substrate 15, which is a double-sided board, can be obtained by peeling the dry film. In addition, the substrate 15 may be formed by a semi-additive method. In detail, after the electroless copper plating, exposure and development processes may be performed to form a plating resist in a predetermined pattern. In this state, after applying the electrolytic copper plating to the electroless copper plating layer serving as the common electrode, the resist may be dissolved first and any unnecessary electroless copper plating layer may be removed by etching. Consequently, the substrate 15, which is a double-sided board, may be obtained.

Next, after providing a film-like interlayer insulation material 14 on the main surface of the substrate 15, the protective film 12 may be laminated on the main surface of the substrate 15 having said interlayer insulation material 14 thereon through a lamination process using, for example, a conventionally known laminating machine. In detail, first a plurality of the substrates 15 is horizontally adjoined, and the protective film 12 capable of covering the main surface of the entire substrates 15 may be laminated by a laminate machine (no illustration). Then, the laminated protective film 12 may be cut into the size of each substrate 15. After that, an exposure of the interlayer insulation material 14 may be conducted.

Then, the substrate 15 having the interlayer insulation material 14 protected by the protective film 12 may be conveyed to the film piercing mechanism 2. Next, the through-hole formation process S1 (peeling opportunity portion formation process) shown in FIG. 3 may be conducted. In detail, the periphery portion of the protective film 12 may be pierced with the needles 57 to form the through-holes 16 in the side edge thereof in the traveling direction. Then, the air pocket 17 (see FIG. 4) is formed around the through-holes 16 provided in the protective film 12 when the needles 57 are pulled out therefrom.

After the through-hole formation process S1, a taping process S2 (see FIG. 3) is conducted. In detail, the substrate 15 is conveyed to the film peeling mechanism 4, and a plurality of the substrates 15 is adjoined and located while providing the clearance 20 between the edges 18, 19 of the substrates 15 (see FIG. 5). Next, the tape 31 is affixed so that the portion where the air pocket 17 formed in the protective film 12 and the periphery portion of the protective film 12 of another substrate 15 in the traveling direction may be connected using the taping mechanism 5 (see FIGS. 6 and 7). Specifically, first, a tape supply process S2-1 (see FIG. 3) that lets out the tape 31 on the protective film 12 using the tape supply roller 64 is conducted. A tape cutting process S2-2 that cuts the supplied tape 31 by the tape cutter 62 may then be conducted (see FIGS. 3 and 6). After the tape cutting process S2-2, a tape pressing process S2-3 that presses the tape 31 against the edges 18 and 19 of the substrates 15 with the tape pressing roller 63 may be conducted (see FIGS. 3 and 7). Accordingly, the tape 31 can connect the protective films 12, and then the taping process S2 is completed.

In addition, the tape pressing process S2-3 may be conducted prior to the tape cutting process S2-2. That is, the tape pressing process S2-3 may be carried out, and after that the tape 31 may be cut by the tape cutter 62 during the tape cutting process S2-2.

After the taping process S2, a peeling process S3 (refer to FIG. 3) which continuously peels the protective films 12 connected to each other by sequentially lifting the protective films 12 via the tape 31. In the peeling process S3, the guide roller 33 is positioned so as to touch the protective film 12, which has not been peeled, provided on the substrate 15, and the rotation axis of the guide roller 33 is located near the center of the substrate 15 rather than the edge 18 thereof. Then, the protective films 12 connected by the tapes 31 are pulled and lifted along the periphery surface of the guide roller 33 (see FIG. 8). In detail, as the tape 31 is lifted by the pulling rollers 38, the capacity of air pocket 17 will be gradually expanded. At this time, the air pocket 17 provided on an edge portion 13 is extended outward to the end portion of the edge portion 13 from the vicinity of the through-holes 16. Consequently, the air pocket 17 is extended to the entire width of the edge portion 13, thereby the edge portion 13 may be separated from the interlayer insulation material 14.

After the peeling process S3, a protective film collection process S4 that rolls up and collects the protective films 12, which has already been peeled, to the paper tube 34 may be conducted. Consequently, the protective film 12 is peeled completely from the substrate 15, and the interlayer insulation material 14 serving as the interlayer insulation layer of the build-up multilayer resin wiring board may remain thereon (see FIG. 9). Further, the substrate 15 that the protective film 12 has been peeled therefrom is conveyed by the substrate discharge mechanism 3.

Then, the interlayer insulation material 14 on the substrate 15 that has been conveyed is exposed. As a result, the interlayer insulation layer having vias corresponding to the positions in which via conductors are to be formed may be formed. Next, electroless copper plating may be applied to the interlayer insulation layer according to, for example, a conventionally known technique (e.g. semi-additive method), and then the exposure and development processes may be performed to form the plating resist in a predetermined pattern. In this state, the electrolytic copper plating may be applied to the electroless copper plating layer serving as the common electrode in order to form via conductors inside of the vias, as well as to form the copper plating layer on the interlayer insulation layer. Furthermore, a second conductor layer may be formed on the interlayer insulation layer by, for example, dissolving the resist and etching an unnecessary electroless copper plating layer (conductor formation process).

Then, the interlayer insulation layer and the conductor layer may be alternately laminated by repeating the above-mentioned processes of laminating-conductor formation. Accordingly, the build-up layer may be so constituted, and the predetermined build-up multilayer resin wiring board may be completed.

Therefore, according to certain embodiments, the following effects can be obtained.

(1) According to certain embodiments, each protective film 12 can be connected by the tape 31 in the taping mechanism 5 during the taping process S2. Then, in the peeling process S3, the film peeling mechanism 4 peels the protective film 12 continuously by sequentially lifting the protective film 12 via the tape 31. Accordingly, when a plurality of the substrates 15 is subjected to the peeling process S3, an efficient peeling operation of the protective films 12 may be facilitated because a plurality of the protective films 12 can be peeled collectively. Further, since the protective films 12 are connected to each other by the tapes 31, a plurality of the protective films 12 can be collected together, such that an efficient collection thereof may be facilitated.

In certain embodiments, the peeling process S3 is preferably conducted after the operation where the knurling roll or film pressing member, etc. are moved in the plane direction of the protective film 12, and is instead conducted after the taping process S2 which affixes the tape 31 by the taping mechanism 5. Thus, the interlayer insulation material 14 or the substrate 15 is unlikely to be damaged due to the peeling operation of the protective film 12, such that a lowered yield may be prevented. Further, the less damage there is to the interlayer insulation material 14, the fewer particles that may be generated due to collapse of a part of the interlayer insulation material 14. Accordingly, a lowered yield resulting from particles affecting the interlayer insulation material 14 can be prevented.

(2) In the peeling process S3 of certain embodiments, the guide roller 33 is located so as to touch the protective film 12, such that the substrate 15 may be prevented from being lifted when the protective film 12 is raised. Thus, the substrate 15 from which the protective film 12 has been peeled can be assuredly transferred to between discharge rollers 46, and conveyed to the substrate discharge mechanism 3 successfully.

(3) For example, if any heat treatment is required when the tape 31 affixed by the taping mechanism 5 during the taping process S2 is affixed to the protective film 12, the heat may affect the interlayer insulation material 14 (for example, thermosetting etc.). However, since the tape 31 affixed in the taping process S2 of certain embodiments is an adhesive tape having an adhesive layer, no heat is required at the time of application. Thus, it is unlikely that the heat etc. may affect the interlayer insulation material 14, such that a lowered yield resulting from the heat can be prevented.

(4) If the tape pressing process S2-3 is carried out prior to the tape cutting process S2-2, it may be difficult for the tape pressing roller 63 to contact a certain portion of the tape 31 (the portion that is cut in the tape cutting process S2-2) even though the tape 31 is pressed in the tape pressing process S2-3. For this reason, the entire tape 31 may not be firmly pressed on the substrate 15. As a result, when the protective films 12 are lifted via the tapes 31 in the peeling process S3, they might be separated from each other due to detachment of the tape 31. Further, even if the entire tape 31 is firmly pressed on the substrate 15 in the tape pressing process S2-3, the protective film 12 and the interlayer insulation material 14 may be damaged by the tape cutter 62 in the tape cutting process S2-2.

On the other hand, in certain embodiments, the tape cutting process S2-2 may be carried out prior to the tape pressing process S2-3. Therefore, the tape pressing roller 63 can touch the entire top surface of the tape 31 in the tape pressing process S2-3, and thereby, the entire tape 31 can be firmly pressed on the substrate 15. Accordingly, the tape 31 may not be peeled easily, such that the separation of the protective films 12 may be avoided. Furthermore, since the tape 31 is pressed on the substrate 15 in the tape pressing process S2-3 after cutting the tape 31, the protective film 12 and the interlayer insulation material 14 may hardly be damaged by the tape cutter 62.

(5) In the taping process S2, it is possible that a plurality of the protective films 12 can be connected without cutting one strip of the tape 31. However, in certain embodiments, the tape 31 may be cut to a short length and affixed so as to connect the adjoined protective films 12. In this way, since the lengthy tape 31 is not required for connecting the protective films 12, the amount of tape 31 used can be reduced. That is, because the tape 31 may be cut using the tape cutter 62, the amount of tape 31 used can be minimized.

In addition, certain embodiments can be modified as follows.

In certain embodiments, the film peeling mechanism 4 may include the guide roller positioning mechanism which positions the guide roller 33 such that the rotation axis of the guide roller may be located near the center of the substrate 15 rather than the edge 18 thereof. For example, the guide roller 33 may be mounted so as to rotate around the rotation axis, and may include the guide roller positioning mechanism constituted by an actuator, such as an air cylinder, that makes the rotation axis move along the traveling direction of the substrate 15.

In this way, even if the rotation axis of the guide roller 33 is located outside of the substrate 15 rather than the edge 18 thereof, the rotation axis of the guide roller 33 can be moved to near the center of the substrate 15 rather than the edge 18 of the substrate by driving the air cylinder. Thus, the entire protective film 12 can be assuredly peeled without accurately positioning the substrate 15.

As shown in FIG. 10, the film rolling-up mechanism 7 may include a clutch mechanism 81 which adjusts the transferred amount of rotational driving force between the paper tube 34 and a motor for the paper tube drive 39. For example, the clutch mechanism 81 may be constituted by a paper tube side plate 82 fixed to a paper tube support axis 40, a motor side plate 84 fixed to a rotation axis 83 of the motor for the paper tube drive 39, and a spring (no illustration) bonding the paper tube side plate 82 and the motor side plate 84 together.

In the protective film collection process S4, as the protective films 12 are coiled around the paper tube 34, the outer diameter of the portion where the protective films 12 are coiled may become great. Thus, the rolled-up amount of protective films 12 at one rotation of the paper tube support axis 40 and the paper tube 34 may increase. At this time, if the bonding force by the spring is made weak in order to mutually slide the paper tube side plate 82 and the motor side plate 84, the rotation speed of the paper tube support axis 40 and the paper tube 34 can be slowed because the transferred amount of rotational driving force may become small. Therefore, peripheral speed of the protective film 12 can be maintained at the same level as the speed with which the protective film 12 is pulled by the pulling roller 38. Thus, the tape 31 can be prevented from cutting due to an excessive peripheral speed of the protective film 12.

Although the film peeling apparatus 1 of certain embodiments has been used for forming the interlayer insulation layer of the build-up multilayer resin wiring board, it may also be used for forming an insulation layer of a wiring board other than the build-up multilayer resin wiring board.

The film peeling apparatus 1 of certain embodiments has been used for peeling the protective film 12 laminated on the substrate 15 on which the interlayer insulation material 14 is provided. However, the film peeling apparatus 1 of certain embodiments may be used for peeling the protective film 12 from the insulation material forming solder resist and plating resist. Further, the film peeling apparatus 1 of the embodiment of the present invention may be used for peeling a carrier film from a substrate on which resist films or interlayer insulation material films are laminated and further a surface layer thereof may be covered with the carrier film (protective film).

The film peeling apparatus 1 of certain embodiments has been used for manufacturing wiring boards, such as the build-up multilayer resin wiring board. However, the film peeling apparatus 1 is not necessarily used only for manufacturing wiring boards, but may also be used for peeling the protective film 12 when manufacturing things other than wiring boards.

Based on an assumption that the substrate 15 has a protective film 12 laminated on one of the sides thereof, the substrate discharge mechanism 3 of certain embodiments discharges the substrate 15, where the peeling operation has been completed in the film peeling mechanism 4, from the film peeling apparatus 1.

However, the substrate discharge mechanism 3 may also be a mechanism that discharges a substrate 15 having protective films 12 on both sides thereof. That is, the substrate discharge mechanism 3 may also function as a reversal mechanism which reverses the substrate 15 after any one of the protective films 12 provided on the substrate 15 is peeled therefrom (refer to FIG. 11). In this case, if the substrate 15, from which any one of the protective films 12 provided on the substrate 15 has been peeled, is reversed by the reversal mechanism, the other side of protective film 12 can be peeled, thereby peeling both protective films 12. Further, without changing the arrangement modes, such as the taping mechanism 5 and the film peeling mechanism 4, the protective films 12 provided on both sides of the substrate 15 can be peeled. Furthermore, a peeling operation may be facilitated because the substrate 15 is reversed by the reversal mechanism, such that manual reversal action may not be required.

Figure 11:
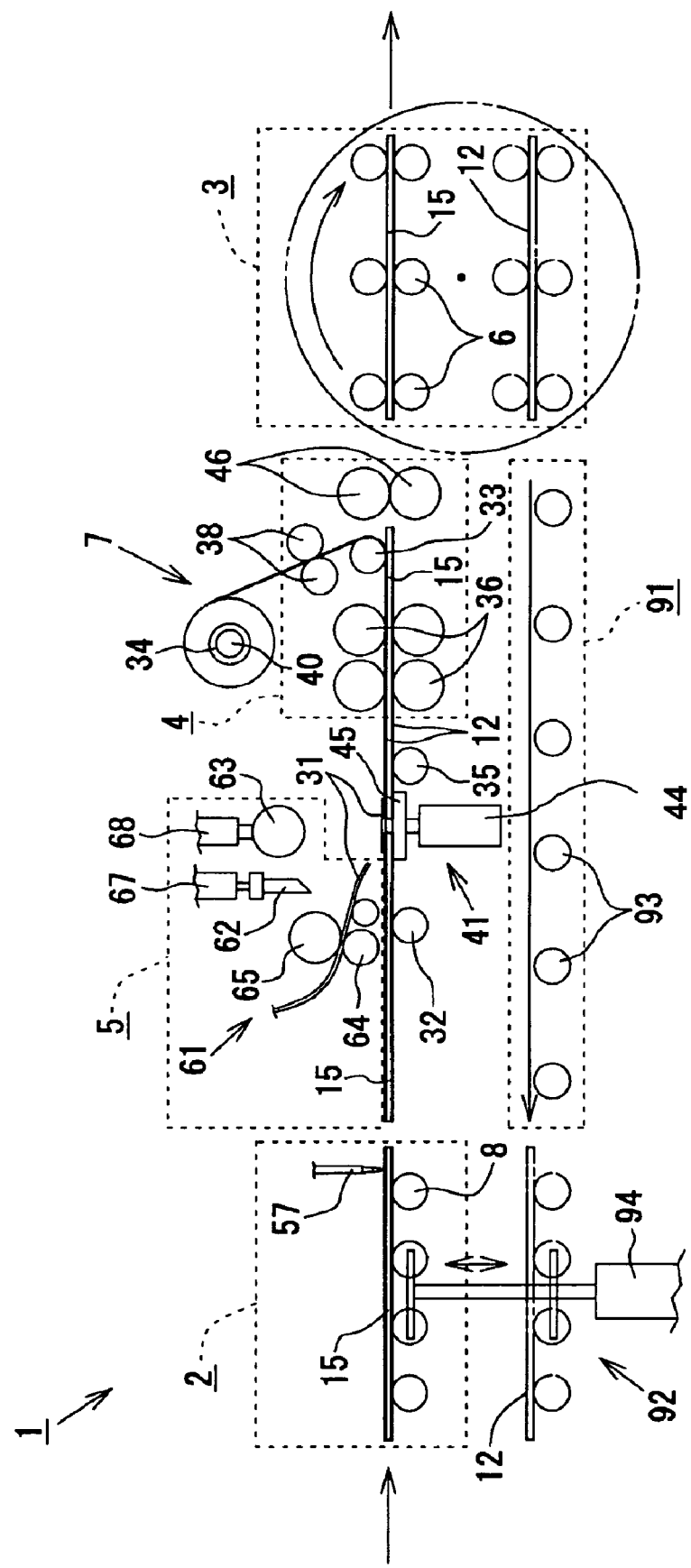
FIG. 11 is a schematic view showing a film peeling apparatus according to another embodiment.

In addition, in this case, the film peeling apparatus 1 preferably includes a substrate return mechanism 91 and a substrate lift mechanism 92 (refer to FIG. 11). The substrate return mechanism 91 comprises a plurality of rollers 93 for transferring a substrate located underneath of the film peeling mechanism 4 and the taping mechanism 5. The substrate return mechanism 91 returns the substrate 15 reversed by the reversal mechanism to the film piercing mechanism 2 (substrate lift mechanism 92) by rotating each roller 93 for transferring the substrate. Further, the substrate lift mechanism 92 includes an air cylinder 94 and substrate support rollers 8 attached at the front end of a rod of the air cylinder 94, and moves up and down by the air cylinder 94. The substrate lift mechanism 92 lifts the substrate 15 conveyed by the substrate return mechanism 91 and supported by the substrate support rollers 8, and conveys the substrate 15 to the film piercing mechanism 2. In this way, only one set of the taping mechanism 5, the film peeling mechanism 4, etc. is required when both protective films 12 provided on the substrate 15 are necessary to be peeled.

Next, the technical concept gained from the above-mentioned embodiments is listed below.

(1) A method for manufacturing a wiring board through a process that peels a protective film from a substrate having an insulation material layer protected by the protective film, wherein the method comprises: a taping process which supports a plurality of the substrates adjoined under the condition that the edges of the substrates are placed close to each other, and which affixes a flexible tape to the edge of the substrate at more than one location so as to connect the protective films; and a peeling process which continuously peels the protective films connected to each other by lifting them sequentially via each tape after the taping process so that the insulation material layer may remain on the substrate.

(2) A method for manufacturing a wiring board through a process that peels a protective film from a substrate having an insulation material layer protected by the protective film, wherein the method comprises: a taping process which supports a plurality of the substrates adjoined under the condition that the edges of the substrates are positioned so as to oppose to each other, and which affixes a flexible tape to the edge of the substrate at more than one location so as to connect the protective films; and a peeling process which continuously peels the protective films connected to each other by lifting them sequentially via the tapes after the taping process so that the insulation material layer may remain on the substrate.

(3) A method for manufacturing a wiring board through a process that peels a protective film from a substrate having an insulation material layer protected by the protective film, wherein the method comprises: a taping process which supports a plurality of the substrates adjoined under the condition that a clearance between the edges of the substrates is shorter than the length of the substrate in the traveling direction of the substrate, and which affixes a flexible tape to the edge of the substrate at more than one location so as to connect the protective films; and a peeling process which continuously peels the protective films connected to each other by lifting them sequentially via the tapes after the taping process so that the insulation material layer may remain on the substrate.

(4) A method for manufacturing a wiring board through a process that peels a protective film from a generally oblong-shaped substrate having an insulation material layer protected by the protective film, wherein the method comprises: a taping process which supports a plurality of the substrates adjoined under the condition that a clearance between the edges of the substrates is shorter than a side length of the substrate parallel to the traveling direction of the substrate, and which affixes a flexible tape to the edge of the substrate at more than one location so as to connect the protective films; and a peeling process which continuously peels the protective films connected to each other by lifting them sequentially via the tapes after the taping process so that the insulation material layer may remain on the substrate.

(5) A method for manufacturing a wiring board through a process that peels a flexible protective film from a substrate having an insulation material layer protected by the protective film, wherein the method comprises: a taping process which supports a plurality of adjoined substrates and affixes a flexible tape to the edge of the substrate so as to connect the protective films; and a peeling process which continuously peels the protective films connected to each other by lifting them sequentially via the tapes after the taping process so that the insulation material layer may remain on the substrate.

(6) A method for manufacturing a wiring board through a process that peels a protective film from a substrate having an insulation material layer protected by the protective film, wherein the method comprises: a taping process which supports a plurality of adjoined substrates and establishes the length of the longest side of the substrate to be 60 cm or less, and which affixes a flexible tape to the edge of the substrate so as to connect the protective films; and a peeling process which continuously peels the protective films connected to each other by lifting them sequentially via the tapes after the taping process so that the insulation material layer may remain on the substrate.

(7) A method for manufacturing a wiring board through a process that peels a protective film from a substrate having an insulation material layer protected by the protective film, wherein the method comprises: a taping process which supports a plurality of the substrates adjoined under the condition that the edges of the substrates are placed close to each other, and which affixes a flexible tape to the edge of the substrate so as to connect the protective films; and a peeling process which continuously peels the protective films connected to each other by lifting them sequentially via the tapes after the taping process so that the insulation material layer may remain on the substrate, and wherein the taping process includes a tape supplying process which lets out the tape on the protective film, a tape cutting process which cuts the tape supplied after the tape supplying process, and a tape pressing process which presses the tape supplied after the tape supplying process against the edge of the substrate.

(8) A method for manufacturing a wiring board through a process that peels a protective film from a substrate having an insulation material layer protected by the protective film, wherein the method comprises: a taping process which supports a plurality of the substrates adjoined under the condition that the edges of the substrates are placed close to each other, and which affixes a flexible tape to the edge of the substrate so as to connect the protective films; and a peeling process which continuously peels the protective films connected to each other by lifting them sequentially via the tapes after the taping process so that the insulation material layer may remain on the substrate, and wherein the taping process preferably includes a tape supplying process which lets out the tape on the protective film, a tape cutting process which cuts the tape supplied after the tape supplying process, and a tape pressing process which presses the tape cut after the tape cutting process against the edge of the substrate.

(9) A film peeling apparatus for peeling a protective film from a substrate having an insulation material layer protected by the protective film, wherein the film peeling apparatus comprises: a peeling opportunity portion formation means which forms the peeling opportunity portion on the periphery of the protective film in order to peel the protective film; a substrate support means which supports a plurality of the substrates adjoining each other; a taping means which affixes a flexible tape so that each protective film is connected at the peeling opportunity portion of the substrate being supported by said substrate support means; and a peeling mechanism which continuously peels the protective films connected via the tapes by lifting them sequentially via the tapes, and wherein the taping means includes a tape supplying means which lets out the tape on the protective film, a tape cutting means which cuts the tape supplied after the tape supplying means, and a tape pressing means which presses the tape cut after the tape cutting means against the edge of the substrate.

It should further be apparent to those skilled in the art that various changes involved in detail of the invention as shown and described may be made. It is intended that such changes be included within the spirit and scope of the claims appended hereto.

This application is based on Japanese Patent Application No. 2004-350569, filed Dec. 3, 2004, Japanese Patent Application No. 2004-350570, filed Dec. 3, 2004, and Japanese Patent Application No. 2005-179082, filed Jun. 20, 2005, incorporated herein by reference in their entirety.

What is claimed is:

1. A method for manufacturing a wiring board through a process that peels protective films (12) from a substrate (15) having an insulation material layer (14) protected by said protective films (12), which comprises:

a taping process (S2) which supports a plurality of the substrates (15) that are placed close to each other, and affixes flexible tapes (31) to edges (18, 19) of the substrates (15) so as to connect said protective films (12); and a peeling process (S3) which continuously peels said protective films (12) connected to each other by lifting them sequentially via said tapes (31) after said taping process so that said insulation material layer (14) may remain on said substrate (15).

2. A method for manufacturing the wiring board as claimed in claim 1, wherein said taping process (S2) affixes said tapes (31) under the condition that said substrates (15) are positioned so that said edges (18, 19) thereof are placed close to each other.

3. A method for manufacturing the wiring board as claimed in claim 1, wherein said taping process (S2) affixes said tapes (31) under the condition that said substrates (15) are positioned so as to provide a clearance (20) between said edges (18, 19) thereof.

4. A method for manufacturing the wiring board as claimed in claim 1, wherein said peeling process (S3) locates a guide roller (33) so as to touch said protective films (12), which has not been peeled, provided on said substrates (15), and positions a rotation axis of said guide roller near the center of said substrate rather than the edges (18, 19) thereof, and lifts said protective film (12) connected by said tape (31) while pulling said protective films (12) along a peripheral surface of said guide roller (33).

5. A method for manufacturing the wiring board as claimed in claim 1, further comprising protective films collection process (S4), wherein said protective films (12), which has already been peeled, is rolled up and collected.

6. A method for manufacturing the wiring board as claimed in claim 1, wherein said tapes (31) affixed during said taping process (S2) is an adhesive tape having an adhesive layer.

7. A method for manufacturing the wiring board as claimed in claim 1, wherein said substrates (15) have a generally rectangular shape with the four sides having lengths of 60 cm or less.

8. A method for manufacturing a wiring board through a process that peels protective films (12) from a plurality of substrates (15) having an insulation material layer (14) protected by said protective films (12), which comprises:

a peeling opportunity portion formation process (S1) which forms a peeling opportunity portion (16) on a periphery of said protective films (12);

a taping process (S2) which supports a plurality of the substrates (15) adjoined under the condition where edges (18, 19) of the substrates are placed close to each other after said peeling opportunity portion formation process (S1), and which affixes flexible tapes (31) so that said protective films (12) may be connected to each other in said peeling opportunity portion (16); and a peeling process (S3) which continuously peels said protective films (12) connected to each other by lifting them sequentially through said tapes (31) after said taping process (S2) so that said insulation material layer (14) may remain on said substrates (15).

9. A method for manufacturing a wiring board through a process that peels a protective films (12) from a plurality substrates (15) having an insulation material layer (14) protected by said protective films (12), which comprises:

a through-hole formation process (S1) which forms a plurality of through-holes (16) by piercing a periphery portion of said protective films 12 with a plurality of needles (57);

a taping process (S2) which supports a plurality of the substrates (15) adjoined under the condition that the edges (18, 19) of the substrates are placed close to each other after said through-hole formation process (S1), and which affixes flexible tapes (31) so that said protective films (12) may be connected to each other at an air pocket (17) formed around said through-holes (16); and a peeling process (S3) which continuously peels said protective films (12) connected to each other by lifting them sequentially via said tapes (31) after said taping process (S2) so that said insulation material layer (14) may remain on said substrate (15).

\* \* \* \* \*